United States Patent
Hawkins et al.

(10) Patent No.: US 7,205,782 B2
(45) Date of Patent: Apr. 17, 2007

(54) SCANNED IMPEDANCE IMAGING SYSTEM METHOD AND APPARATUS

(75) Inventors: Aaron Hawkins, Provo, UT (US); Travis Oliphant, Spanish Fork, UT (US); Stephen Schultz, Spanish Fork, UT (US)

(73) Assignee: Brigham Young University, Provo, UT (US)

( * ) Notice: Subject to any disclaimer, the term of this patent is extended or adjusted under 35 U.S.C. 154(b) by 46 days.

(21) Appl. No.: 11/179,873

(22) Filed: Jul. 11, 2005

(65) Prior Publication Data

US 2007/0007975 A1 Jan. 11, 2007

(51) Int. Cl.
*G01R 31/00* (2006.01)
*A61B 5/05* (2006.01)

(52) U.S. Cl. .................. 324/750; 324/612; 324/158.1; 600/547

(58) Field of Classification Search .............. 600/547; 324/500

See application file for complete search history.

(56) References Cited

U.S. PATENT DOCUMENTS

| | | | | |
|---|---|---|---|---|
| 6,122,544 A * | 9/2000 | Organ | ........................ | 600/547 |
| 6,596,507 B2 * | 7/2003 | Ossart | ........................ | 435/29 |
| 2002/0149377 A1 * | 10/2002 | Hefti et al. | ................. | 324/636 |
| 2004/0087869 A1 * | 5/2004 | Treppo et al. | .............. | 600/547 |
| 2004/0164748 A1 * | 8/2004 | Chheda et al. | .............. | 324/649 |

OTHER PUBLICATIONS

Rui Shao, Sergei Kalinin, and Dawn A. Bonnell Local Impedance Imaging and spectoscopy of polycrystaline ZnO using contact atomic force microscopy, Applied Physics Letters, Mar. 24, 2003, pp. 1869-1871, vol. 82 No. 12, American Institute of Physics.

Hongze Liu, Aaron R. Hawkins, Stephen M. Schultz, Travis E. Oliphant, Numerical Model for Low Frequency Scanning Impedance Imaging, Dec. 5, 2004, Electrical and Computer Engineering Dept., Brigham Young University, Provo Utah 84602.

Aaron R. Hawkins, Hongze Liu, Stephen M. Schultz, Travis E. Oliphant, Noncontact scanning impedance imaging in an aqueous solution, Applied Physics Letters, Aug. 9, 2004, pp. 1080-1082, vol. 85 No. 6, American Institute of Physics.

* cited by examiner

*Primary Examiner*—Ha Tran Nguyen
*Assistant Examiner*—Emily Y Chan
(74) *Attorney, Agent, or Firm*—Steve McDaniel

(57) ABSTRACT

The resolution and contrast of impedance measurements and scans are improved by using a non-contact impedance probe comprising an inner conductor configured to bear a measurement signal and an outer conductor configured to bear a shielding signal. The measurement signal and shielding signal are selected to increase the directionality of the flux emitted from the impedance probe. In one embodiment, the measurement signal and the shielding signal are phase locked signals. A sample may be placed in a basin having a conductive surface that receives the flux emitted from the impedance probe. By filling the basin with a conductive solution, direct contact between the probe and the sample may be avoided along with the associated variability in contact resistance. The small highly-directional flux emitting area achievable with the present invention enables high resolution high contrast non-contact scanning of biological and non-biological materials.

10 Claims, 6 Drawing Sheets

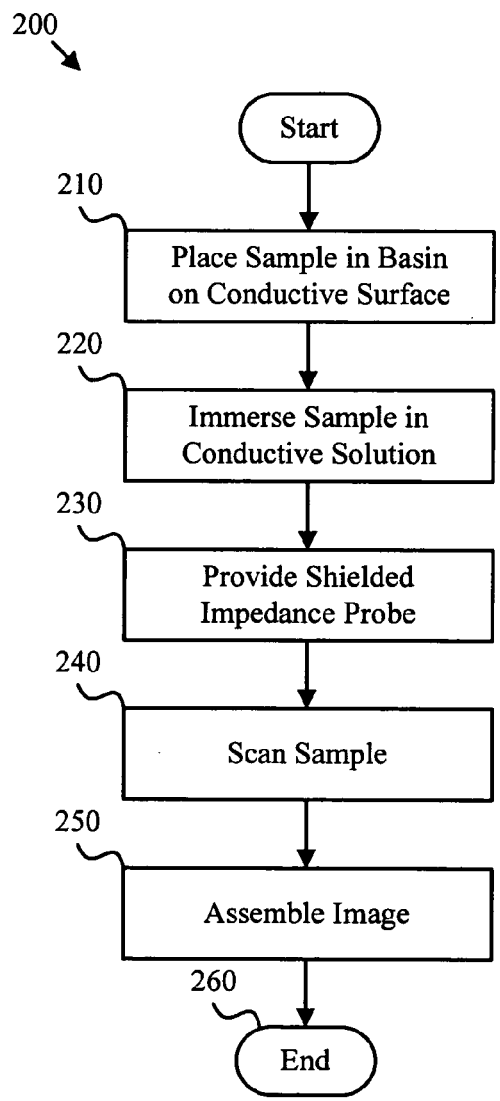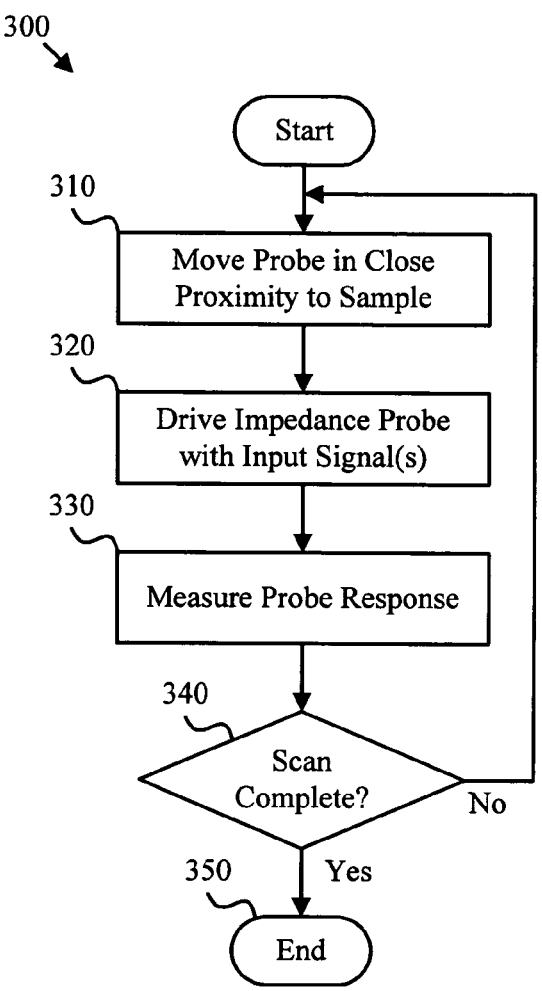
Fig. 2
Fig. 3

SCANNED IMPEDANCE IMAGING SYSTEM METHOD AND APPARATUS

BACKGROUND OF THE INVENTION

1. Field of the Invention

This invention relates generally to imaging systems, methods, and apparatus and more particularly relates to systems, methods, and apparatus for non-contact impedance scanning and imaging.

2. Description of the Related Art

Imaging provides valuable data on the properties and composition of materials and objects to a wide variety of individuals and enterprises including researchers, engineers, manufacturers, and medical professionals. Image quality is directly dependent on the resolution and contrast of the particular technology used to generate the image data.

Image resolution has been driven to the submicron-scale using small step scanning. Examples of this include atomic force microscopy (AFM), scanning electron microscopy (SEM), near field scanning optical microscopy (NSOM), etc. These methods are typically limited to providing surface profiles of the scanned matter. Similarly, image contrast has been improved through methods that penetrate an object such as fluorescence imaging, magnetic resonance imaging (MRI), and electrical impedance tomography.

For example, tomographic reconstruction has been used to create electrical impedance images of materials. These electrical impedance images can show useful information about human tissue composition enabling several medical applications including cancer diagnosis. However, the resolution of electrical impedance tomography is very low, limiting its usefulness.

The measurement of impedance differences in materials could potentially provide some of the largest measurable contrasts in the natural world. In particular, a high-resolution electrical impedance image of biological tissues could reveal a great deal of information due to the biologically significant behavior of electrically active ions (e.g., sodium, potassium, chlorine, and calcium), polar molecules (e.g., water), and inhomogeneous charge distributions (e.g., most proteins).

Measurements of electrical impedance of biological samples (including cells) can help illuminate both tissue structure and function, and can therefore play an important role in several medical applications such as cancer diagnosis and treatment. As early as 1923, Grant found that at 1 kHz cancer cells have a lower resistivity than normal cells. More recently, other applications have been suggested such as using impedance to classify breast lesions or to observe activity of white blood cells.

One prior art approach to collecting impedance data is direct contact measurement. Unfortunately, direct contact measurements may disturb or harm the material being tested. Furthermore, contact resistance can vary significantly with surface conditions of both the probe and the material resulting in inconsistent measurements. Consequently, direct contact impedance measurements on biological tissues have been crude and unable to provide data on a cellular size scale.

From the foregoing discussion, it should be apparent that a need exists for a system, method, and apparatus for high resolution impedance measurement and scanning of the electrical impedance of biological and non-biological matter. Beneficially, such a system and method would provide valuable data for research, medical, and industrial purposes.

SUMMARY OF THE INVENTION

The present invention has been developed in response to the present state of the art, and in particular, in response to the problems and needs in the art that have not yet been fully solved by currently available imaging means and methods. Accordingly, the present invention has been developed to provide a system, method, and apparatus for scanned impedance imaging that overcome many or all of the above-discussed shortcomings in the art.

Specifically, the non-contact scanned impedance imaging described herein provides the resolution and imaging capabilities of scanning and may also eliminate the variations in contact resistance that are associated with other techniques. This is especially important for soft tissues or materials with large impedances where contact resistance can vary significantly with the surface conditions of both the probe and the material.

In one aspect of the present invention, a system for non-contact impedance measurement of a sample includes an impedance probe configured to provide electrical flux, a basin comprising a conductive surface configured to receive the electrical flux from the impedance probe, and a scanner configured to move the impedance probe in close proximity to a sample placed within the basin. The basin is also configured to retain a conductive solution thereby enabling non-contact measurement of the impedance of a material.

In certain embodiments, the impedance probe comprises inner and outer conductors such that the outer conductor shields the inner conductor. In one embodiment, the outer conductor is coaxial to the inner conductor. Electrical flux directionality and focus is improved by bearing phase-locked signals on the inner and outer conductor thus increasing local flux density and constraining the area of the sample receiving electrical flux from the inner conductor. One or more signal generators may directly or indirectly provide the phase-locked signals propagated by the impedance probe.

In another aspect of the present invention, a method for non-contact impedance measurement of a sample includes providing an impedance probe configured to provide electrical flux, providing a basin comprising a conductive surface configured to receive electrical flux from the impedance probe, and moving the impedance probe in close proximity to a sample submerged in a conductive solution within the basin.

The method may also include collecting and/or recording a plurality of impedance measurements to provide an impedance image of the sample. In certain embodiments, the impedance probe used in the describe method has an outer conductor that shields as inner conductor to improve electrical flux directionality and measurement resolution as previously described.

In another aspect of the present invention, an apparatus for non-contact impedance measurement of a sample includes an impedance probe comprising an inner conductor configured to bear a measurement signal, an outer conductor configured to bear a shielding signal, and an insulator configured to insulate the inner conductor from the outer conductor. The inner conductor, outer conductor and insulator may be made from materials suitable for immersion into an aqueous solution.

The apparatus may also include a reference impedance element connected in series to the inner conductor, and a signal generator configured to provide a signal corresponding to the measurement signal to the reference impedance element, and also provide the shielding signal to the outer conductor. The measurement signal and the shielding signal are preferably phase locked. In one embodiment, the measurement signal and the shielding signal are the same signal.

In certain embodiments, multiple impedance probes are integrated onto a substrate in a 1-D or 2-D arrangement. In one embodiment, a common outer conductor is shared among multiple impedance probes.

The present invention improves impedance measurement and scanning, is compatible with state of the art microfabrication techniques and enables in vitro imaging of biological tissue. It should be noted that references within this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

The aforementioned features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 2 is a flowchart diagram depicting one embodiment of an impedance imaging method of the present invention;

FIG. 3 is a flowchart diagram depicting one embodiment of an impedance scanning method of the present invention;

DETAILED DESCRIPTION OF THE INVENTION

Some of the functional units described in this specification have been explicitly labeled as modules, (while others are assumed to be modules) in order to emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Figure 1:
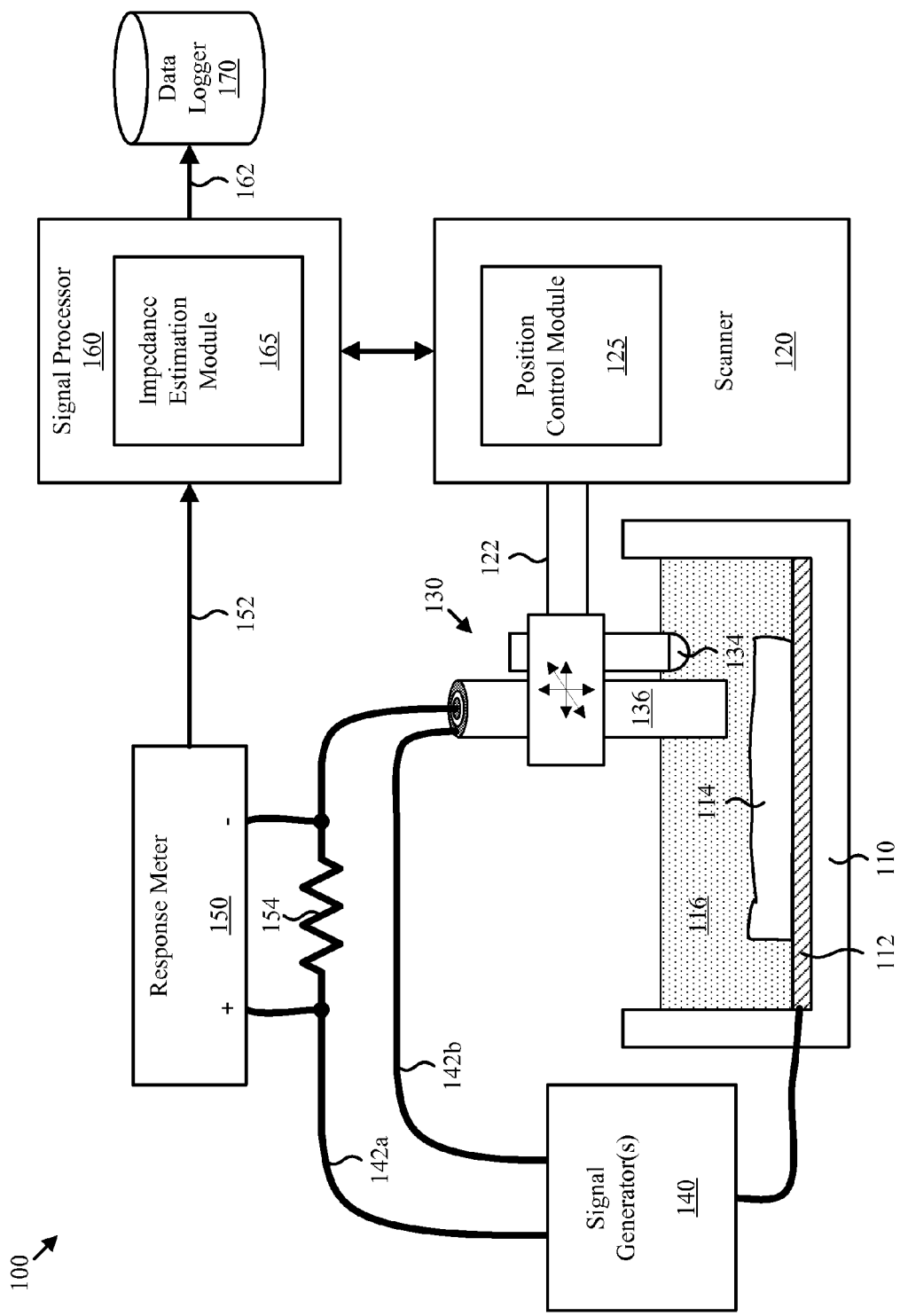
FIG. 1 is a schematic block diagram depicting one embodiment of a impedance measurement and imaging system of the present invention.

FIG. 1 is a schematic block diagram depicting one embodiment of an impedance measurement and imaging system 100 of the present invention. As depicted, the impedance measurement and imaging system 100 includes a basin 110, a scanner 120 and scanhead 130, one or more signal generators 140, a response meter 150, a signal processor 160, and a data logger 170. The various components of the impedance measurement and imaging system 100 facilitate conducting an impedance scan of a sample while providing good image resolution and contrast.

The basin 110 includes a conductive surface 112. A sample 114 is placed on the conductive surface 112 and immersed in a conductive solution 116. The use of the conductive solution 116 enables the transfer of electrical flux between an impedance probe 136 and the conductive surface 112 (through the sample 114) without requiring direct contact between the sample 114 and the impedance probe 136.

The conductive solution 116 also bridges any gaps that may be present between the conductive surface 112 and the sample 114 resulting in more consistent measurements for the impedance measurement and imaging system 100 over prior art systems.

The scanner 120 moves the scanhead 130 to a desired position via one or more position actuators 122. In the depicted embodiment, a position control module 125 is able to position the tip of the impedance probe 136 anywhere within the basin 110. A height sensor 134 may be used to detect the height of the impedance probe 136 above the sample and/or the conductive surface 112.

One or more signal generators 140 provide one or more input signals 142 to the impedance probe 136. In the depicted embodiment, two phase-locked input signals 142a and 142b are generated. The response meter 150 measures the response of the impedance probe 136 to the inputs signals 142 via a reference impedance 154. In the depicted embodiment, the reference impedance is a resistor and the response meter 150 is a voltmeter connected across the resistor. In another embodiment, the response meter 150 is connected to the conductive surface 112 (which is grounded) and to the junction of the reference impedance 154 and the impedance probe 136.

The signal processor 160 receives a measured response 152 from the response meter 150. The signal processor 160 may process a series of measured responses 152 corresponding to one or more scanned positions. In the depicted embodiment, an impedance estimation module 165 converts one or more measured responses 152 to an estimated impedance. An array of estimated impedances corresponding to a grid of measured positions may be assembled by the signal processor into an impedance image 162 and stored on the data logger 170.

FIG. 2 is a flowchart diagram depicting one embodiment of an impedance imaging method 200 of the present invention. As depicted, the impedance imaging method 200 includes placing 210 a sample in a basin, immersing 220 the sample in a conductive solution, providing 230 a shielded impedance probe, scanning 240 the sample, and assembling 250 an impedance image. The impedance imaging method 200 facilitates obtaining a high resolution high contrast impedance image.

Placing 210 a sample in a basin may include obtaining a thin slice of material or tissue for analysis, and centering the sample on the conductive surface 112. Immersing 220 the sample with a conductive solution may include selecting a conductive solution with a desired conductivity and filling the basin with the conductive solution. In one embodiment, the conductivity of the conductive solution is preferably between 1000 ohm-cm and 20 Mohm-cm.

Providing 230 a shielded impedance probe may include providing an impedance probe that increases electrical flux directionality through the use of a shield that bears a shielding signal that is phase-locked with a measurement signal present on the inner conductor or probe tip. The depicted method proceeds by scanning 240 the sample and assembling 250 an impedance image. Subsequently the method ends 260.

The use of a shielded impedance probe that provides highly directional electrical flux enables the collection of high contrast volumetric measurement. Furthermore, resolution is increased by the use of small step scanning and using a probe having a small inner conductor (or tip) diameter in close proximity to the sample. In certain embodiments, the scan step distance, tip diameter, and probing distance (i.e. height) are approximately equal and less than 30 micrometers thus enabling the detection of cellular size features and the like.

FIG. 3 is a flowchart diagram depicting one embodiment of an impedance scanning method 300 of the present invention. The depicted scanning method 300 includes moving 310 a probe in close proximity to a sample, driving 320 the impedance probe with one or more input signals, measuring 330 a probe response, and testing 340 if the scan is complete. The scanning method 300 is one example of the scan sample operation 240 depicted in FIG. 2 and may be conducted by the impedance measurement and imaging system 100.

Moving 310 a probe in close proximity to a sample may include using feedback from sensors such as the height sensor 134 to estimate the current position of the scan head 130 and/or impedance probe 136. Driving 320 the impedance probe with one or more input signals facilitates measuring 330 a probe response for the system. In one embodiment, the impedance probe 136 is driven with two phase-locked signal selected to increase the measurement resolution of the impedance probe 136.

In one embodiment, the probe response is measured by measuring a voltage across a reference impedance and calculating the current that flows through the tip of the impedance probe and thereby deriving the impedance between the probe 135 and the conductive surface 112.

Subsequent to measuring 330 the probe response, the method proceeds by testing 340 if the scan is complete. If the scan is not complete, the method loops the move probe operation 310. If the scan is complete the method ends 350.

Figure 4A:
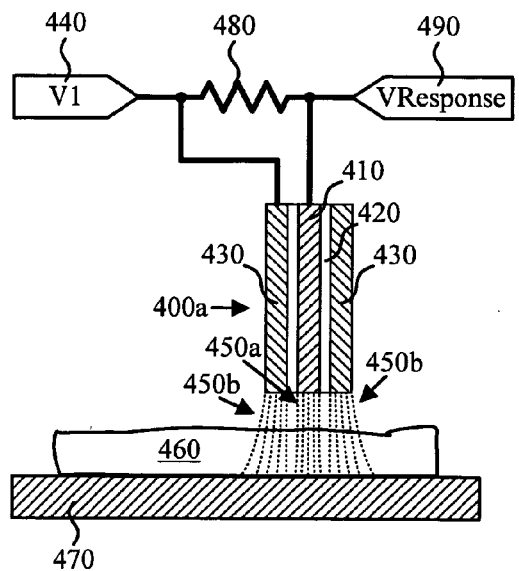
FIGS. 4a and 4b are schematic illustrations depicting the operation of two embodiments of an impedance probe of the present invention.
Figure 4B:
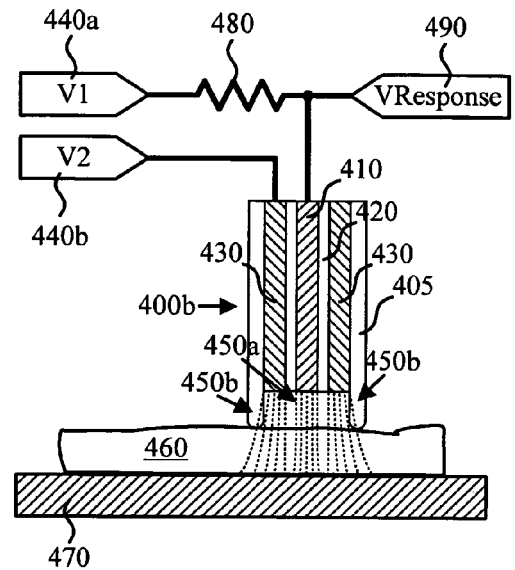

FIGS. 4a and 4b are schematic illustrations depicting the operation of two embodiments of an impedance probe 400 of the present invention. As depicted, the impedance probe 400 includes an inner conductor 410, an insulator 420, and an outer conductor 430. The impedance probe 400 is driven by one or more inputs signals 440 to provide electrical flux 450 across a sample 460 to a conductive surface 470. Preferably, the impedance probe 400 and sample 460 are immersed in a conductive solution (not shown).

A reference impedance 480 facilitates measuring the current that flows through the inner conductor 410. In the depicted embodiment, the conductive surface 470 is grounded. By measuring a voltage response 490, and subtracting that voltage from the (known) voltage of the input signal 440(a) the electrical flux 450a (i.e. the current) flowing from the inner conductor 410 and through the sample 460 may be calculated. One of skill in the art will appreciate that the impedance of the sample 460 directly affects the flux flowing through the sample and therefore the voltage response 490.

The outer conductor or shield 430 improves the directionality of the electrical flux 450a by providing additional flux 450b that is phase-locked to the flux 450a. Consequently, the flux 450b flowing from the outer conductor 430 competes for impingement area on the conductive surface 470. As a result, the impingement area of the flux 450a is constrained by the presence of flux 450b resulting in a higher resolution impedance measurement over an unshielded probe or a shielded probe where the shield is merely grounded.

The frequency content of the input signal(s) 440 may be selected to provide maximum measurement contrast for the sample 460. To provide greater control over the flux 450b and the impingement area of flux 450a, the impedance probe embodiment of FIG. 4b includes separate phase-locked input signals 440*a* and 440*b*. For example, increasing the amplitude of the input signal 440*b* over the amplitude of input signal 440*a* may reduce the impingement area of flux 450*a* and the resolution of the impedance measurement and imaging system 100.

One of skill in the art will appreciate that the resolution, accuracy, and contrast of the present invention may be affected by a variety of factors such as variations in the thickness of the sample 460, and the distance between the sample 460 and the probe 400. In certain embodiments, a variety of sensors such as the height sensor 134 are provided on the scanning head 130 and elsewhere, that facilitate controlling or accounting for such factors.

In certain embodiments, the thickness of the sample 460 is derived from the information provided by the height sensor 134 and the actuators 122 of the scanner 120. In other embodiments, a probe sleeve or spacer 405 facilitates attaining a fixed height between the sample 460 and the probe 400. In one embodiment, the probe sleeve or spacer 405 is porous to facilitate flow of the conductive solution 116. The conductivity of the probe sleeve or spacer 405 may be matched to the conductivity of the conductive solution 116.

Figure 5:
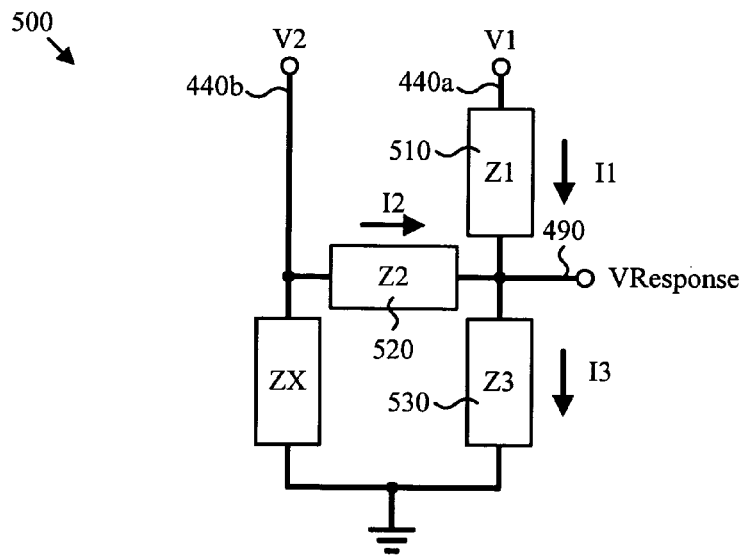
FIG. 5 is a schematic diagram depicting a circuit model of one embodiment an impedance probe of the present invention.

FIG. 5 is a schematic diagram depicting a simplified circuit model 500 for the impedance probe 400*b*. The circuit model 500 facilitates modeling and visualizing the performance of the impedance probe 400*b*.

The impedance 510 corresponds to the reference impedance 480, while the impedance 520 models the stray impedance or capacitance between the inner conductor 410 and the outer conductor 430. The impedance 530 includes the impedance of the inner conductor 410 and that portion of the sample 460 and the conductive solution through which the flux 450*a* flows. FIG. 5 illustrates that a current I3 flowing through the impedance 530 is the sum of the currents I1 and I2 flowing through impedances 510 and 520 respectively. Thus the impedance 530 may be computed by knowing the reference impedance 480, the voltage of the input signal(s), and the response voltage 490.

Figures 6A, 6B:
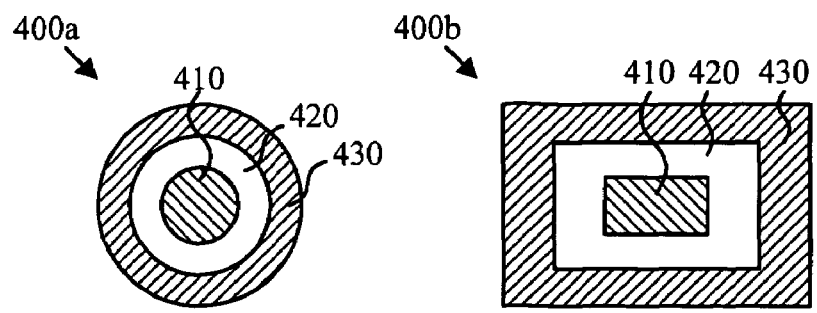
FIGS. 6a and 6b are end view illustrations depicting alternate geometries of an impedance probe of the present invention.

FIGS. 6*a* and 6*b* are end view illustrations depicting example geometries of the impedance probe 400 of the present invention. As previously depicted, the impedance probe 400 includes an inner conductor 410, an insulator 420, and an outer conductor 430. The depicted geometries are intended to be exemplary and not limit one of skill in the art from other geometries suitable for particular applications. For example, some applications may require a probe tip that is elongated in a particular direction.

The sizing of the various elements may affect the performance of the impedance probe 400. For example, simulations and experiments conducted by the applicants have shown (and common sense indicates) that the resolution attainable by the present invention is inversely related to the area of the probe tip or inner conductor 410 and the distance of the probe tip from the sample surface. Consequently, to achieve higher measurement resolution it is desirable to make the inner conductor 410 as thin as practically attainable.

Simulations and experiments have also shown that the optimum thickness of the insulator 420 or the outer conductor 430 is typically between 0.1 and 10 times the diameter of the probe tip and is dependent on a variety of factors such as input frequency, sample thickness, material impedance, probe distance, and input signal power. For example, a circular shaped probe tip with a diameter of 30 micrometers for the inner conductor and a thickness of approximately 100 micrometers for the outer conductor exhibits high resolution measurements when the outer conductor is separated from the inner conductor with an insulator with a thickness of 30 micrometers.

Figure 7:
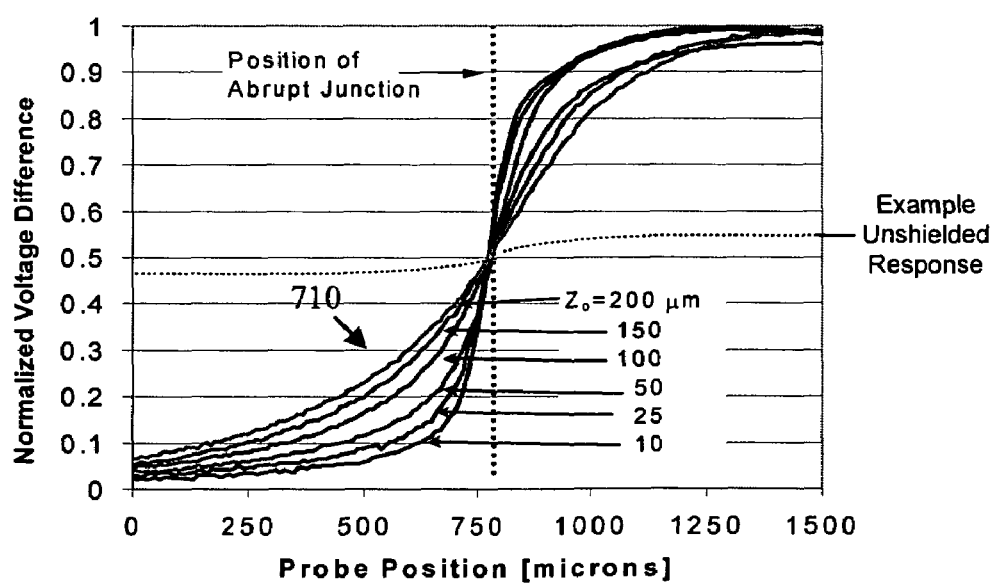
FIG. 7 is a graph depicting a normalized response function for one embodiment an impedance probe of the present invention.

FIG. 7 is a graph depicting a normalized response function for one embodiment an impedance probe of the present invention. The depicted graph includes a number of response curves 710 that were collected at an abrupt junction at a variety of probe distances. The response curves 710 demonstrate the increase resolution attainable with closer probe distances.

Figure 8A:
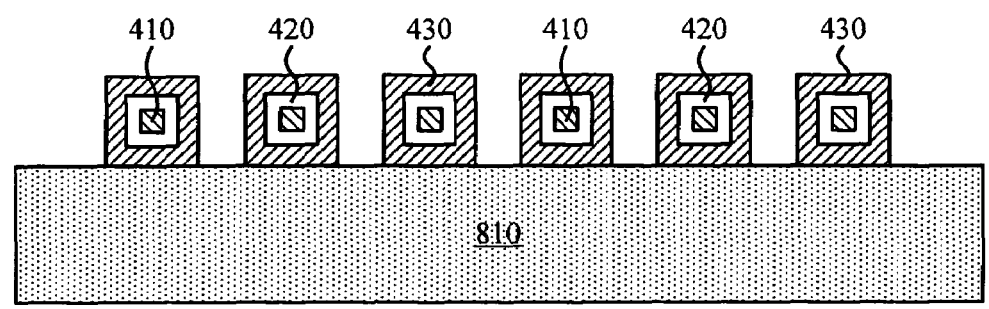
FIGS. 8a and 8b are end view illustrations depicting alternate embodiments of a 1-D scanning array of the present invention.
Figure 8B:
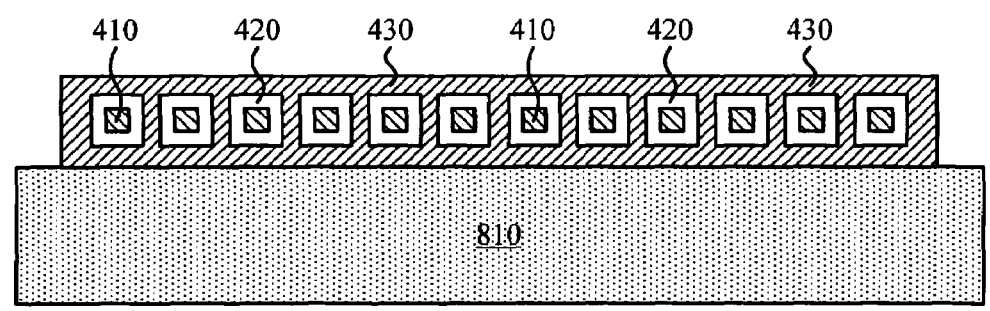

FIGS. 8*a* and 8*b* are end view illustrations depicting alternate embodiments of a 1-D scanning array 800 of the present invention. The depicted embodiments include multiple probes 400 combined into a single scanning unit. The probes 400 may be integrated onto a substrate 810. In one embodiment, the substrate 810 is silicon and the elements are fabricated using lithographic and other techniques used in fabricating integrated circuits.

As depicted elsewhere, the probes 400 include inner conductors 410 and insulators 420 shielded by one or more outer conductors 430. The scanning array 800*b* in FIG. 8*b* shares a common outer conductor 430 for all of the probes 400. In such an embodiment, the shielding signal may need to be increased in amplitude to compensate for the increased (flux emitting) area of the outer conductor 430.

Figure 9:
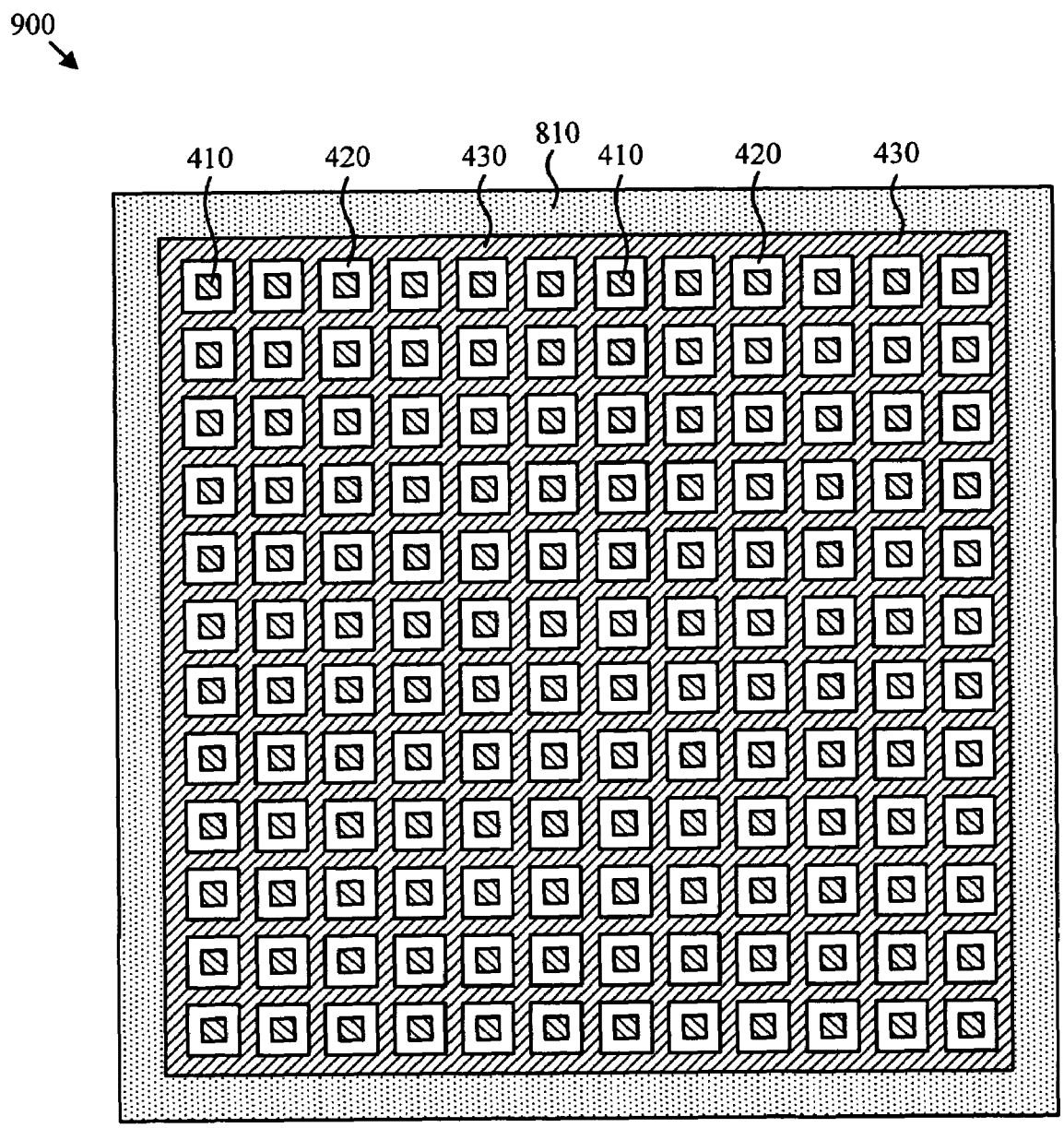
FIG. 9 is a top view illustration depicting one embodiment of a 2-D scanning array of the present invention.

FIG. 9 is a top view illustration depicting one embodiment of a 2-D scanning array 900 of the present invention. The 2-D scanning array extends the concepts of the 1-D scanning array 800 to two dimensions. In one embodiment, each inner conductor 410 is fabricated above a resistor element to enable measurement of the probe response for each probe 400. The outer conductor 430 may be common to each probe element by encompassing each conductor 410 and insulator 420.

The present invention provides improved impedance measuring and scanning of biological and non-biological materials. The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for non-contact impedance measurement of a sample, the system comprising:

an impedance probe comprising an inner conductor, an insulator, and an outer conductor, the outer conductor configured to shield the inner conductor, the insulator configured to insulate the inner conductor from the outer conductor, and wherein the inner conductor, insulator, and outer conductor comprise materials suitable for immersion into an aqueous solution;

a reference impedance element connected in series to the inner conductor; and a signal generator configured to provide a first input signal to the reference impedance element and a second input signal to the outer conductor, wherein the first and second input signals are selected to improve electrical flux directionality and measurement resolution.

2. The apparatus of claim 1, wherein the first and second input signals are phase locked.

3. The apparatus of claim 1, wherein the first and second input signals are the same signal.

4. The apparatus of claim 1, wherein a plurality of impedance probes are integrated onto a substrate.

5. The apparatus of claim 1, further comprising a spacer configured to maintain a substantially fixed distance between the inner conductor and a sample.

6. The apparatus of claim 1, wherein the inner conductor has a diameter of less than 500 micrometers.

7. The apparatus of claim 6, wherein the insulator has a thickness that is greater than 0.1 times, and less than 10 times, the diameter of the inner conductor.

8. The apparatus of claim 6, wherein the outer conductor has a thickness that is greater than half the diameter of the inner conductor.

9. The apparatus of claim 1, wherein the inner conductor has a diameter of less than 500 micrometers.

10. The apparatus of claim 9, wherein a plurality of impedance probes have a common outer conductor.

* * * * *